US009608636B2

United States Patent
Lau (10) Patent No.: US 9,608,636 B2
(45) Date of Patent: Mar. 28, 2017

(54) HIGH-VOLTAGE TOLERANT INPUT VOLTAGE BUFFER CIRCUIT

(71) Applicant: INTEL CORPORATION, Santa Clara, CA (US)

(72) Inventor: Ker Yon Lau, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/129,238

(22) PCT Filed: Sep. 24, 2013

(86) PCT No.: PCT/US2013/061491
§ 371 (c)(1),
(2) Date: Dec. 24, 2013

(87) PCT Pub. No.: WO2015/047230
PCT Pub. Date: Apr. 2, 2015

(65) Prior Publication Data
US 2016/0197613 A1    Jul. 7, 2016

(51) Int. Cl.
*H03K 19/0185* (2006.01)
*H03K 19/003* (2006.01)
*H03K 19/0175* (2006.01)
*H03K 5/08* (2006.01)
*G06F 1/26* (2006.01)
*H03K 17/16* (2006.01)

(52) U.S. Cl.
CPC ....... *H03K 19/018521* (2013.01); *G06F 1/26* (2013.01); *H03K 5/08* (2013.01); *H03K 17/162* (2013.01); *H03K 19/00361* (2013.01); *H03K 19/00369* (2013.01); *H03K 19/017509* (2013.01); *H03K 2217/0018* (2013.01); *H03K 2217/0036* (2013.01); *H03K 2217/0054* (2013.01)

(58) Field of Classification Search
CPC ............... H03K 19/018521; H03K 19/0013
See application file for complete search history.

(56) References Cited

U.S. PATENT DOCUMENTS

| 6,342,802 B1 | 1/2002 | Forehand |
| 2005/0046449 A1* | 3/2005 | Davis ............... H03K 19/00315 327/112 |
| 2006/0018064 A1 | 1/2006 | An |

(Continued)

OTHER PUBLICATIONS

Notification Concerning Transmittal of International Preliminary Report on Patentability of the International Searching Authority issued for International Patent Application No. PCT/US2013/061491, mailed Apr. 7, 2016.

(Continued)

*Primary Examiner* — Albert Wang
(74) *Attorney, Agent, or Firm* — Blakely, Sokoloff, Taylor & Zafman LLP (57) ABSTRACT

Described is an apparatus comprising a first node to receive signal; a second node to provide an output signal; a voltage limiter circuit operating under a first supply voltage, the voltage limiter coupled to the first and the second nodes; and a bypass circuit operating under the first supply voltage, the bypass circuit coupled to the voltage limiter circuit and is capable of being enabled to electrically short the first node to the second node.

16 Claims, 7 Drawing Sheets

(56) References Cited

U.S. PATENT DOCUMENTS

2007/0210838 A1* 9/2007 Gupta ............ H03K 19/018521
327/112
2010/0176848 A1 7/2010 Du et al.
2012/0223759 A1* 9/2012 Wang ............. H03K 19/018521
327/328
2013/0113542 A1 5/2013 Lee

OTHER PUBLICATIONS

Notification of Transmittal of the International Search Report and the Written Opinion of the Searching Authority, or the Declaration for International Application No. PCT/US2013/061491, mailed Jul. 10, 2014, 7 pages.

* cited by examiner

HIGH-VOLTAGE TOLERANT INPUT VOLTAGE BUFFER CIRCUIT

CLAIM OF PRIORITY

This application claims the benefit of priority of International Patent Application No. PCT/US2013/061491 filed Sep. 24, 2013, titled "HIGH-VOLTAGE TOLERANT INPUT VOLTAGE BUFFER CIRCUIT," which is incorporated by reference in its entirety.

BACKGROUND

A System-on-Chip (SoC) integrates a microprocessor core with numerous interfacing circuitries on the same chip. Such interfacing circuitries, comprising receiver and transmitter pairs, allow the microprocessor core to communicate with other devices, such as memory, audio and video devices, and storage devices. Some of these devices may operate at a very high voltage. For example, Secure Digital (SD) card, which is a non-volatile memory commonly used in many portable devices, operates at 3.3v in default mode and outputs a signal which swings between 3.3v and ground.

SoC interfacing circuitries typically have voltage limiter circuits, which receive high-swing signals from the devices, reduce the swing to a pre-determined value, and send the modified signals to the receiver circuit. Voltage limiter circuits are needed because typically the receiver circuit, fabricated with a low voltage process technology which supports high speed operation but which has lower tolerance for voltage stress, cannot withstand the high-swing signals from the devices that operate at high voltage. Besides, to minimize leakage in the receiver circuit, the voltage limiter circuits' maximum output voltage typically matches or exceeds the supply voltage to the receiver circuit.

On the other hand, devices which the SoC interfaces with may also operate at different voltages for different modes of operation. For example, while SD card's signal swing is 3.3v at default mode, SD card may also have a high speed mode where the data rate doubles, and signal swing reduces from 3.3v to 1.8v. With a reduced input signal swing, the voltage limiter circuit output swing may reduce to a level below the supply voltage to the receiver circuit, which may result in substantial leakage in the receiver circuit. The reduced voltage limiter circuit output swing may also depend on temperature and process skew, which also adds uncertainty to the performance of the voltage limiter and to the amount of leakage in the receiver circuit.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

The embodiments relate to an input voltage buffer circuit, built with low-voltage transistors, that is capable of receiving high-voltage logic levels and limiting its output voltage swing, without subjecting its low-voltage transistors to high-voltage electrical overstress. The embodiments are also capable of receiving low-voltage logic levels without causing leakage to the level-detecting circuit. In one embodiment, the input voltage buffer serves as a voltage limiter to limit its output voltage swing at a pre-determined value when input swing is high, and also maintains its output voltage swing at the same pre-determined value when input swing is reduced.

Embodiments disclose a multi-voltage buffer which can operate in two modes. In one embodiment, in a certain high voltage mode (i.e. first mode), when the maximum input voltage exceeds logical level one (e.g., 1.8v), the multi-voltage buffer can limit its output voltage at the logical level one (e.g., 1.8v). In one embodiment, in a certain low voltage mode (i.e. second mode), when the maximum input voltage is at logical level one, the multi-voltage buffer's maximum output voltage may still be maintained at the logical level one. It is understood that these voltage levels are exemplary only, and the embodiments may be operated when using other voltage conditions and on different processes that give rise to similar problems. In one embodiment, circuit techniques are provided to maintain the output swing of the input voltage buffer at 1.8v, or at a predetermined value, when the input voltage swing is expected to reduce in certain modes of operation.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the convenience of describing various embodiments of the disclosure, the transistors are metal oxide semiconductor (MOS) transistors which include drain, source, gate and bulk terminals. Source and drain terminals may be identical terminals and are interchangeably used herein. Also, typically MOS transistors are designed to sustain a limited voltage difference between any two terminals. Exceeding such a limit, which is also known as electrical overstress, may cause the transistor's oxide layer to degrade much faster, thus shortening their life span. Those skilled in the art will also appreciate that other transistors, for example Bi-polar junction transistors (BJT), Field-effect transistors (FET), etc., may be used without departing from the scope of this disclosure. Herein transistor names that are prefixed with the term "MN" refer to n-type transistors (e.g., NMOS, NPN BJT, NFET, etc.), whereas transistor names that are prefixed with the term "MP" refer to p-type transistors (e.g., PMOS, PNP BJT, PFET, etc.). It is also understood that every transistor can comprise multiple smaller transistors coupled together in parallel, where the source terminals of the smaller transistors are coupled together to form one source terminal of the combined transistor, the drain terminals of the smaller transistors are coupled together to form one drain terminal of the combined transistor, and the gate terminals of the smaller transistors are coupled together to form one gate terminal of the combined transistor.

Figure 1A:
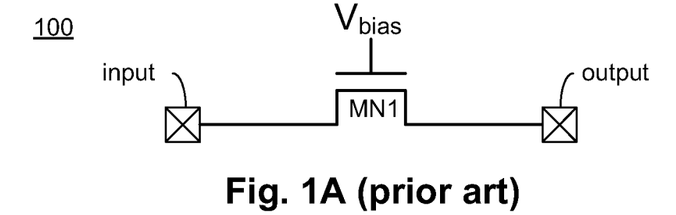
FIG. 1A is a prior-art buffer where the maximum output voltage is equal to one threshold voltage below its gate bias voltage.
Figure 1B:
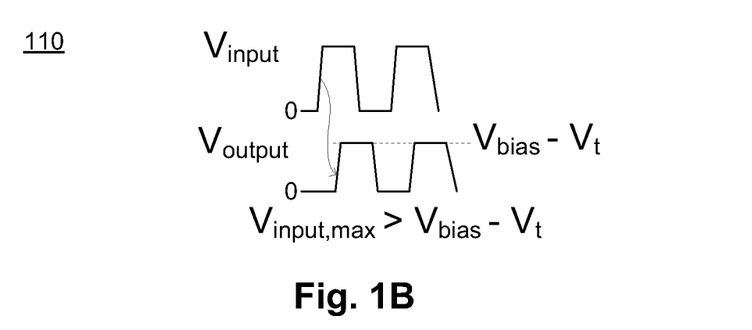
FIG. 1B illustrates waveforms to show that the maximum output voltage of the prior-art buffer of FIG. 1A is limited at one threshold voltage below its gate bias voltage.

FIG. 1A is a prior-art voltage limiter circuit 100 which limits its output voltage. N-type MN1 transistor has a threshold voltage of $V_t$ and is configured as a common-gate amplifier, with its gate terminal coupled to a fixed bias voltage of $V_{bias}$, its drain terminal coupled with the input and its source terminal coupled with the output. MN1 conducts when its drain voltage is lower than its gate voltage $V_{bias}$, by at least one threshold voltage $V_t$. As waveform diagram 110 of FIG. 1B illustrates, the output voltage can track the input voltage until it reaches $V_{bias}-V_t$. As input voltage increases beyond $V_{bias}-V_t$, voltage limiter circuit 100 limits its output voltage substantially at $V_{bias}-V_t$.

Figure 1C:
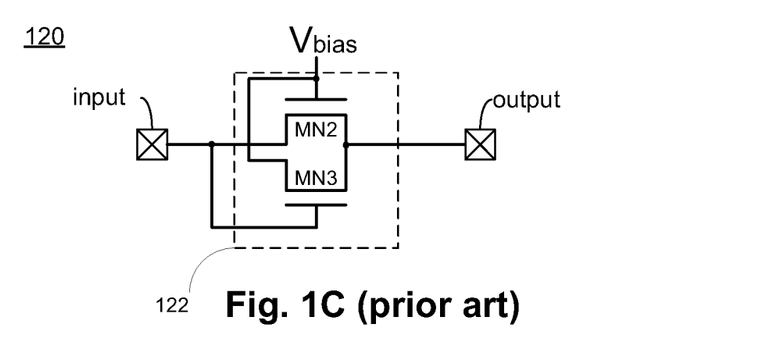
FIG. 1C is a prior-art buffer with a pair of n-type transistors coupled together.
Figure 1D:
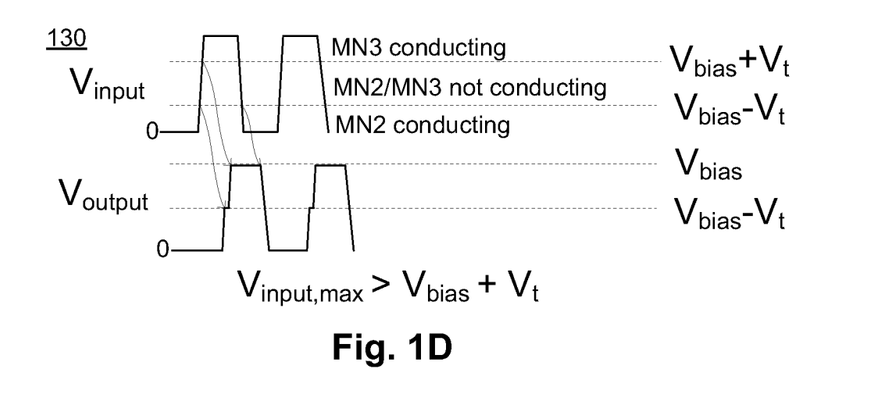
FIG. 1D illustrates waveforms to show that the maximum output voltage of the prior-art buffer of FIG. 1C may reach its gate bias voltage if the input voltage exceeds one threshold voltage above the gate bias voltage.

FIG. 1C shows a circuit 120 which consists a prior-art voltage limiter circuit 122 coupled to an input node and an output node. Voltage limiter circuit 122 consists of two n-type devices MN2 and MN3. MN2 is configured as a common-gate amplifier, with its drain terminal coupled with the input node, its source terminal coupled with the output node, and its gate terminal coupled with a fixed bias voltage source $V_{bias}$. MN3's drain terminal is also coupled with the same fixed bias voltage source $V_{bias}$, with its gate terminal coupled with the input node and its source terminal coupled with the output node. As waveform diagram 130 in FIG. 1D illustrates, when the input voltage is below $V_{bias}-V_t$, MN2 conducts and the output voltage tracks the input voltage. As input voltage increases beyond $V_{bias}-V_t$ but remains below $V_{bias}+V_t$, MN2's source voltage is limited substantially at $V_{bias}-V_t$, while MN3's gate voltage is not high enough to turn on MN3, therefore the output voltage stays substantially at $V_{bias}-V_t$. As the input voltage increases beyond $V_{bias}+V_t$, MN3 turns on and electrically shorts the output node to the fixed bias voltage source, therefore limiting output voltage at $V_{bias}$.

As an example, a fixed bias voltage (Vbias) of 1.8v is connected to both the gate terminal of MN2 and the drain terminal of MN3. For a MOS transistor to conduct, its gate voltage needs to be higher than either its source voltage or its drain voltage by $V_t$ (threshold voltage). For MN2, with a gate voltage of 1.8v, it can conduct when its source voltage is less than or equal to 1.8v−$V_t$. For MN3, with drain voltage of 1.8v and its gate tied to input, it can conduct when its gate voltage exceeds its drain voltage by one $V_t$. When this happens, its source and drain terminals are electrically shorted together, bringing the output voltage to 1.8v. Therefore, voltage limiter circuit 120 limits and maintains the output voltage at 1.8v when the input voltage is at least equal to 1.8v+$V_t$. Besides, as long as the input voltage does not exceed 3.6v, the maximum voltage differences between any two terminals of either MN2 and MN3 can be limited substantially at 1.8v, which is typically small enough to not cause electrical overstress. The choice of bias voltage, as well as the targeted output swing of the buffer, is either specific to the design of the overall system, or is driven by the electrical overstress limits of a particular process technology.

Figure 1E:
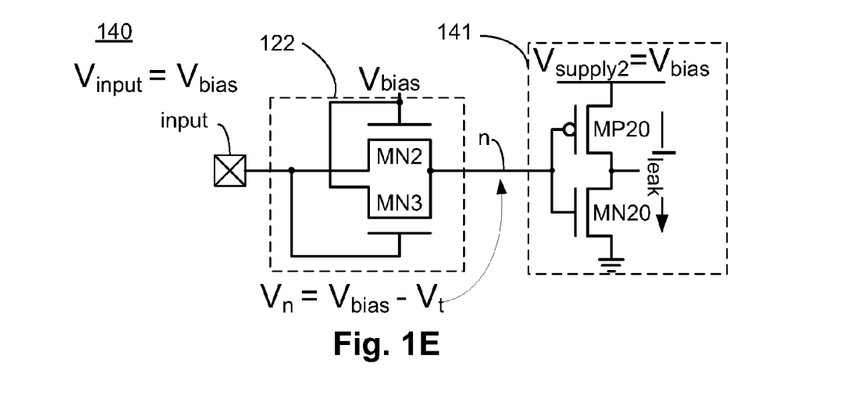
FIG. 1E is a prior art buffer of FIG. 1C in which the maximum output voltage of may decrease with the reduced input swing and may cause leakage for the level-detecting circuit of the buffer.

FIG. 1E shows that voltage limiter circuit 122 in FIG. 1C can cause leakage problems for downstream level-detecting circuit(s). Here the maximum input voltage is equal to $V_{bias}$, while voltage limiter circuit 122 is coupled with a level-detecting circuit 141. In one embodiment, level-detecting circuit 141 comprises a p-type transistor MP20 and a n-type transistor MN20 coupled together to form an inverter circuit, with MN20's source terminal coupled with ground, MP20's source terminal coupled with a supply voltage $V_{supply2}$, the gate terminals of MN20 and MP20 coupled together to form an input, and the drain terminals of MN20 and MP20 coupled together to form an output. The input of level-detecting circuit 141 is coupled with the output of the voltage limiter circuit 122 at node n. In one embodiment, the supply voltage $V_{supply2}$ is equal to $V_{bias}$.

As an example, assuming the fixed bias voltage $V_{bias}$ is at 1.8v, with the input voltage staying at 1.8v for a logical "1," both MN2 and MN3's gate voltages will be at 1.8v. In this example, the source voltages of both transistors, as well as voltage at node n, is limited substantially at 1.8v−$V_t$. For the level-detecting circuit 141, its p-type transistor MP20 has a gate voltage 1.8v–$V_t$ and a source voltage of 1.8v, and may not be fully turned off. On the other hand, the n-type transistor MN20 of level-detecting circuit 141 is turned on with its gate voltage at 1.8v–$V_t$. As a result, a current path may exist between the voltage supply $V_{supply2}$ and ground through MP20 and MN20, causing excessive leakage. To avoid such leakage, the input for level-detecting circuit 141 should be driven to a voltage equal to or exceeding its supply voltage $V_{supply2}$, in this example 1.8v, for a logical '1'.

Figure 2A:
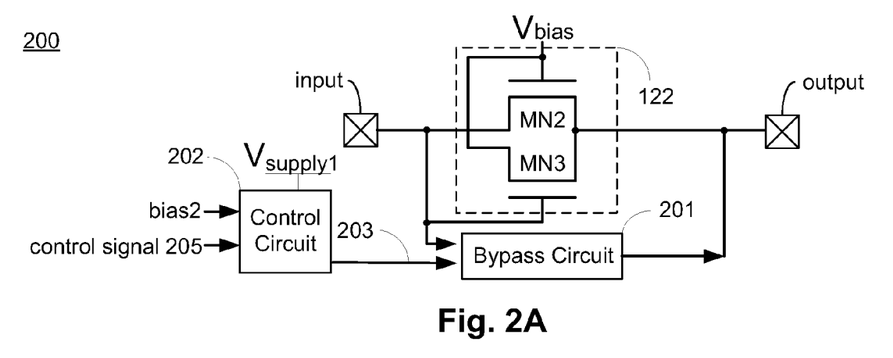
FIGS. 2A-2B show voltage buffers with a bypass circuit to maintain the output swing when the input swing decreases, according to one embodiment of the disclosure.

FIG. 2A illustrates a voltage buffer circuit 200, according to one embodiment, to address the leakage problem in FIG. 1C. It is pointed out that those elements of FIG. 2A having the same reference numbers (or names) as the elements of any other figure can operate or function in any manner similar to that described, but are not limited to such. In one embodiment, voltage buffer circuit 200 comprises voltage limiter circuit 122, bypass circuit 201, and control circuit 202. In one embodiment, both voltage limiter circuit 122 and bypass circuit 201 are coupled to the input node and the output node of voltage buffer circuit 200.

In one embodiment, the maximum output voltage of voltage buffer circuit 200 can be maintained at a pre-determined value (e.g., 1.8v), as long as the maximum input voltage is equal to or exceeds the pre-determined value. In one embodiment, when voltage buffer circuit 200 operates in a low voltage mode where the maximum input voltage is e.g., 1.8v, bypass circuit 201 is activated to couple the input with the output. In one embodiment, when voltage buffer circuit 200 operates in a high voltage mode where the maximum input voltage is higher than e.g., 1.8v, bypass circuit 201 is disabled and voltage limiter circuit 122 limits the maximum output voltage of buffer circuit 200 at e.g., 1.8v. In one embodiment, only voltage limiter circuit 122 is active when bypass circuit 201 is disabled. It is understood that these voltage levels are exemplary only and are either specific to the design of the overall system, or are driven by the electrical overstress limits of a particular process technology. In other embodiments, other voltage levels may be used.

In one embodiment, control circuit 202 controls bypass circuit 201 through control signals 203. In one embodiment, the voltage levels of control signals 203 may change between the high voltage and the low voltage modes to enable or disable bypass circuit 201. In one embodiment, control signals 203 are derived from an external voltage bias2 which can be generated with resistors, transistors, or a combination of both. In one embodiment, control circuit 202 operates under a supply voltage $V_{supply1}$, which is fixed at a value equal to the maximum input voltage (e.g., 3.3v). In another embodiment, control circuit 202 operates under a supply voltage $V_{supply1}$ which may change between the high voltage and low voltage modes, which allows control circuit 202 to detect mode change and to update control signals 203 accordingly. In one embodiment, control circuit 202 receives a control signal 205 which toggles between the high voltage and low voltage modes. In such an embodiment, control circuit 202 can then detect mode change and update control signals 203 accordingly, by monitoring either the supply voltage $V_{supply1}$, control signal 205, or a combination of both.

Figure 2B:
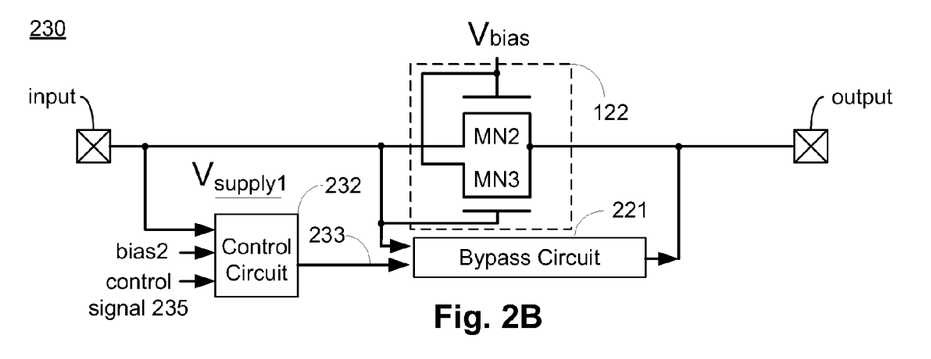

FIG. 2B illustrates a voltage buffer circuit 230, according to one embodiment, to address the leakage problem in FIG. 1C. It is pointed out that those elements of FIG. 2B having the same reference numbers (or names) as the elements of any other figure can operate or function in any manner similar to that described, but are not limited to such. In one embodiment, voltage buffer circuit 230 comprises voltage limiter circuit 122, bypass circuit 221, and control circuit 232. Both voltage limiter circuit 122 and bypass circuit 221 are coupled to the input node and the output node of buffer circuit 230.

In one embodiment, control circuit 232 controls bypass circuit 221 through control signals 233. In one embodiment, the voltage levels of control signals 233 may change to enable or disable bypass circuit 221. In one embodiment, control signals 233 are derived from an external voltage bias2, which can be generated with resistors, transistors, or a combination of both. In one embodiment, control circuit 232 may operate under a supply voltage $V_{supply1}$, which is fixed at a value equal to the maximum input voltage (e.g., 3.3v). In another embodiment, control circuit 232 operates under a supply voltage $V_{supply1}$ which may change between the high voltage and low voltage modes, which allows control circuit 232 to detect mode change and to update control signals 233. In one embodiment, control circuit 232 also receives the input signal.

In one embodiment, based on an instantaneous voltage at the input, control circuit 232 can modify the voltage levels of control signals 223 to disable bypass circuit 221. In one embodiment, control circuit 232 also receives a control signal 235 which toggles between the high voltage and low voltage modes. Control circuit 232 can then detect mode change and update control signals 233 accordingly, by monitoring either the input voltage, the supply voltage control $V_{supply1}$, control signal 235, or any combination.

Figure 3A:
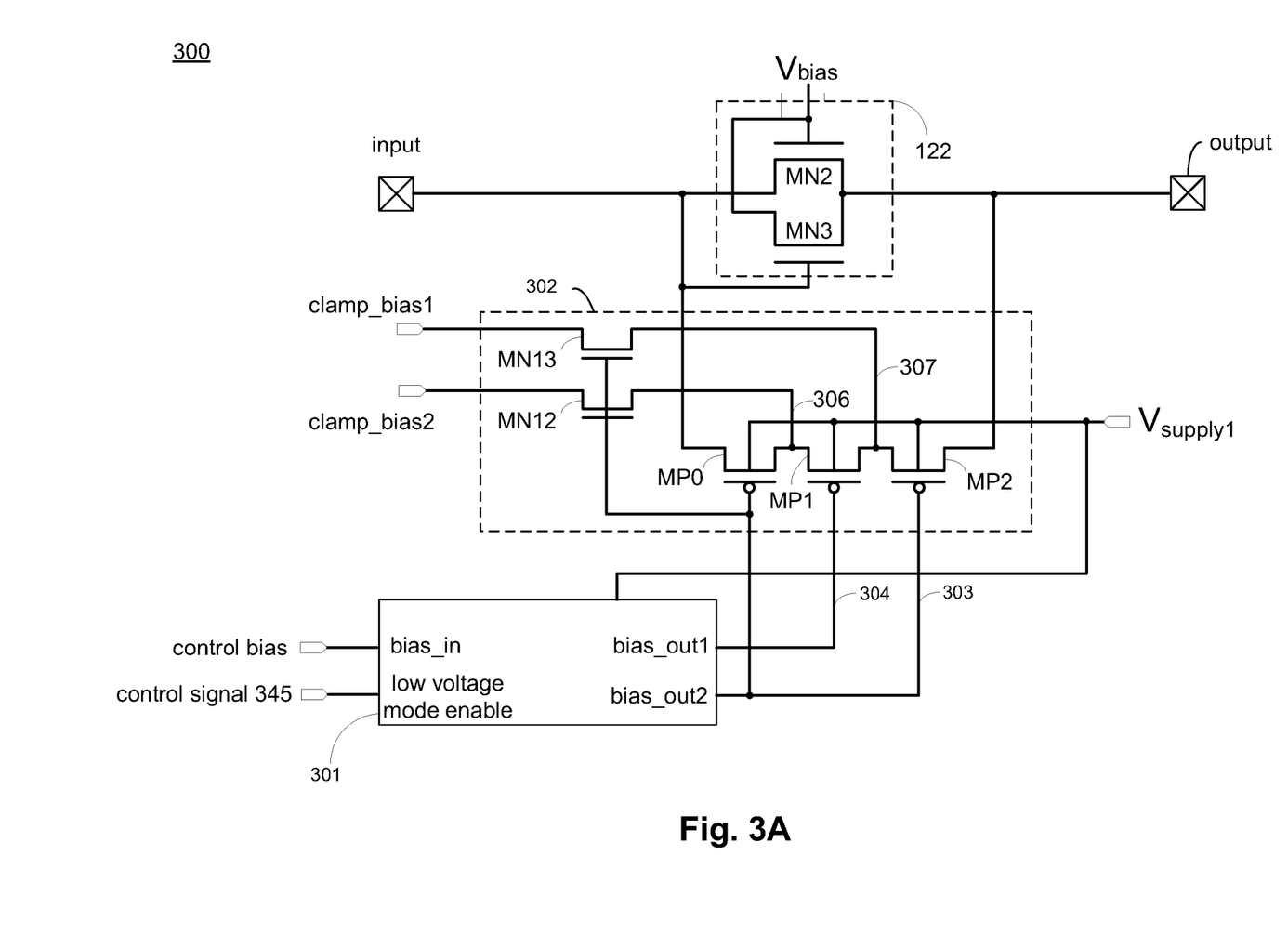
FIGS. 3A-3D are voltage buffers, according to some embodiments of the disclosure.

FIG. 3A shows one implementation of voltage buffer circuit 200 in FIG. 2A, according to one embodiment. It is pointed out that those elements of FIG. 3A having the same reference numbers (or names) as the elements of any other figure can operate or function in any manner similar to that described, but are not limited to such. In one embodiment, voltage buffer circuit 300 comprises voltage limiter circuit 122, bypass circuit 302, and control circuit 301. Both voltage limiter circuit 122 and bypass circuit 302 are coupled to the input node and the output node of voltage buffer circuit 300.

In one embodiment, bypass circuit 302 comprises p-type transistors MP0, MP1 and MP2 coupled together in series, with the bulk of each transistor coupled with a supply voltage $V_{supply1}$. In one embodiment, control circuit 301, operating under supply voltage $V_{supply1}$, controls bypass circuit 302 through control signals 303 and 304. In one embodiment, MP1 of bypass circuit 302 is controlled by control signal 304, while MP0 and MP2 of bypass circuit 302 are controlled by control signal 303. In one embodiment, bypass circuit 302 forms a bypass path from the input to the output of voltage buffer circuit 300 during a low voltage mode, where the maximum input voltage is equal to $V_{bias}$. In one embodiment, during a high voltage mode, where the maximum input voltage exceeds $V_{bias}$, the bypass path formed by bypass circuit 302 is severed by disabling at least MP1.

In one embodiment, during the high voltage mode, control circuit 301 disables bypass circuit 302 by driving control signal 304 to a voltage that is high enough to disable MP1, which is at least equal to $V_{input,max} - V_{tp1}$, where $V_{input,max}$ is the maximum input voltage and $V_{tp1}$ is the threshold voltage of MP1.

In one embodiment, both MP0 and MP2 can shield MP1 from directly coupling with the input node and the output node of buffer circuit 300 during the high voltage mode. Without MP0 or MP2, either MP1's source or drain terminals may reach ground when the voltage at the input of the buffer circuit is at ground, while MP1's gate terminal is driven to a high voltage equal to $V_{input,max}-V_{tp1}$. This can lead to substantial gate-drain and gate-source voltage differences for MP1, which may cause electrical overstress.

In one embodiment, during the high voltage mode, voltage at the gate terminals of MP0 and MP2 is selected to minimize the gate-drain and gate-source voltage differences of both transistors when the input voltage stays at maximum or at ground. In one embodiment, transistors MN12 and MN13 may be added to set the lower voltage limits of nodes 306 and 307, which are coupled with the drain and source terminals of MP1. In one embodiment, both transistors MN12 and MN13 may charge up the drain and source terminals of MP1 when bypass circuit 302 is disabled. In such an embodiment, electrical overstress is mitigated for the transistor MP1 as it exits the low voltage mode and enters the high voltage mode.

In one embodiment, during the low voltage mode operation, control circuit 301 enables bypass circuit 302 by driving control signal 304 to a voltage that is low enough to enable MP1 to at least pass a voltage equal to $V_{bias}$, and by driving control signal 303 to a voltage that is low enough to enable MP0 and MP2 to at least pass a voltage equal to $V_{bias}$. In one embodiment, control signals 303 and 304 may be at a voltage level less than or equal to $V_{bias}-V_{tn}-V_{tp}$, where $V_{tn}$ and $V_{tp}$ are the maximum threshold voltages of all the n-type and p-type transistors in voltage limiter circuit 122 and bypass circuit 302. In such an embodiment, bypass circuit 302 conducts a voltage between $V_{bias}-V_{tn}$ and $V_{bias}$. In one embodiment, voltage limiter circuit 122 may cover input voltage between ground and $V_{bias}-V_{tn}$. In one embodiment, the combination of voltage limiter circuit 302 and bypass circuit 122 allows voltage buffer circuit 300 to conduct a voltage between ground and $V_{bias}$.

An example is provided to illustrate the embodiments. In this example, all fixed bias voltages, including the biases clamp_bias1 and clamp_bias2, the bias to voltage limiter 122 and the control bias to control circuit 301 are set at 1.8v. During a high voltage mode, the maximum input voltage level is at 3.3v, while during a low voltage mode, the maximum input voltage level is at 1.8v. Control circuit 301 operates under a voltage supply $V_{supply1}$ which is at 3.3v during the high voltage mode but which is lowered to 1.8v during the low voltage mode.

Continuing with the example, during the high voltage mode, control signal 304 is raised to 3.3v, which disables MP1 and severs the bypass path between the input node and the output node. Control circuit raise control signal 303 to 1.8v. While MP0 can charge node 306 up to 3.3v as input voltage reaches 3.3v, MN12 can clamp node 306 at $1.8v-V_{tn}$ as input voltage drops below 1.8v. MN13 also can clamp node 307 at around $1.8v-V_{tn}$ as well. As the input voltage swings between ground and 3.3v, the voltage differences between terminals of all the transistors in voltage limiter circuit 122 and bypass circuit 302 is at most 1.8v, which is typically low enough to avoid electrical overstress.

Continuing with the example, during the low voltage mode, control circuit 301 sets control signals 303 and 304 to 0v, thereby activating bypass circuit 302 to allow at least an input voltage of 1.8v to propagate to the output node. It is understood that these voltage levels are exemplary only, and the embodiments may be applied with voltage levels for control signals, voltage supplies and input voltage which differ from what is disclosed in this example.

Figure 3B:
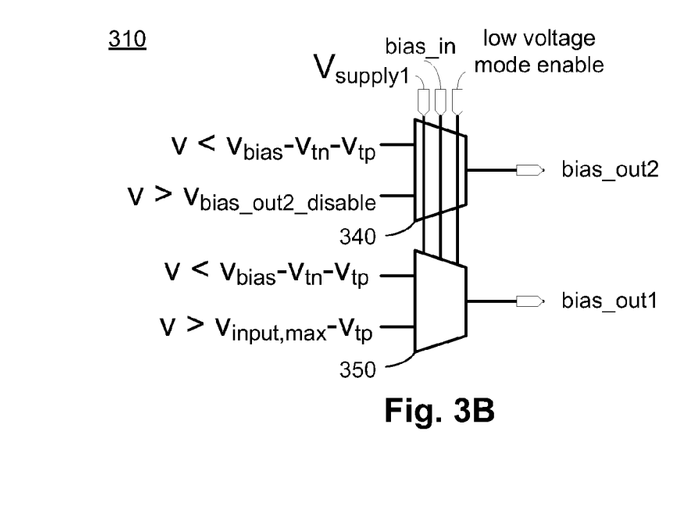

FIG. 3B illustrates one implementation 310 of control circuit 301 of FIG. 3A, according to one embodiment. It is pointed out that those elements of FIG. 3B having the same reference numbers (or names) as the elements of any other figure can operate or function in any manner similar to that described, but are not limited to such. In one embodiment, control circuit 310 comprises logic circuits 340 and 350 to choose different voltage levels for bias_out1 and bias_out2 between a low voltage mode and a high voltage mode. In one embodiment, the high voltage mode is when the maximum input voltage exceeds $V_{bias}$, while the low voltage mode is when the maximum input voltage is equal to $V_{bias}$. In one embodiment, bias_out1 and bias_out2 are control signals 304 and 303 respectively in FIG. 3A.

In one embodiment, logic circuits 340 and 350 may take in a control signal "low voltage mode enable," a bias voltage source "bias_in," and voltage supply $V_{supply1}$, some or all of which may vary between the high voltage and the low voltage modes, to make the selection. In this embodiment, logic circuits 340 and 350 independently choose bias_out1 and bias_out2.

In one embodiment, during the low voltage mode, both bias_out1 and bias_out2 may be chosen to be a voltage below $V_{bias}-V_{tn}-V_{tp}$, where $V_{tn}$ and $V_{tp}$ are respectively the maximum threshold voltages of all the n-type and p-type transistors in bypass circuit 302 and voltage limiter circuit 122 in FIG. 3A. In one embodiment, during the high voltage mode, bias_out1 may be chosen to be a voltage above $V_{input,max}-V_{tp1}$, while bias_out2 may be chosen to be a voltage equal to $V_{bias2\_out\_disable}$, which can be a level specifically chosen to avoid electrical overstress for MP0 and MP2 in FIG. 3A and may depend on process technology and the maximum input voltage level. In one embodiment, the bias voltage source bias_in supplies a voltage equal to $V_{bias}$. In one embodiment, logic circuits 340 and 350 are multiplexer circuits.

Figure 3C:
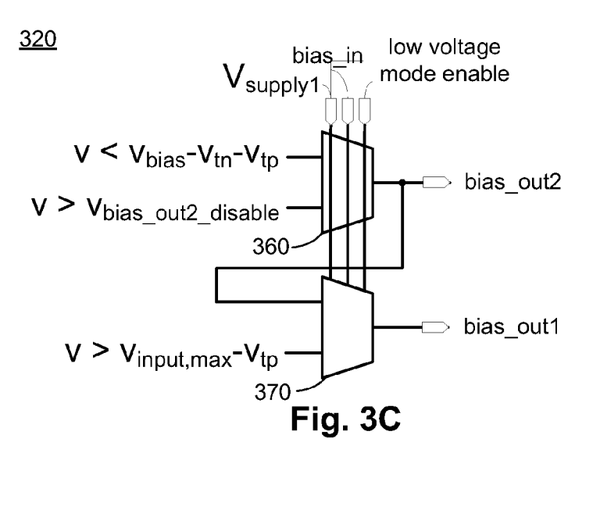

FIG. 3C illustrates another implementation 320 of control circuit 301 of FIG. 3A, according to one embodiment. It is pointed out that those elements of FIG. 3C having the same reference numbers (or names) as the elements of any other figure can operate or function in any manner similar to that described, but are not limited to such. In one embodiment, control circuit 320 comprises logic circuits 360 and 370 to choose different voltage levels for bias_out1 and bias_out2 between the low voltage mode and the high voltage model.

In one embodiment, the output of logic circuit 360, which is bias_out2, is fed into logic circuit 370 as one of the choices for bias_out1. In one embodiment, logic circuits 360 and 370 may take in any combination of a control signal "low voltage mode enable," a bias voltage source "bias_in," and voltage supply $V_{supply1}$, some or all of which may vary between the high voltage and the low voltage modes, to make the selection.

In one embodiment, during the low voltage mode, bias_out2 may be chosen to be a voltage below $V_{bias}-V_{tn}-V_{tp}$, while logic circuit 370 may choose bias_out2 for bias_out1, therefore setting the two outputs to be equal. In one embodiment, during the high voltage mode, bias_out1 may be chosen to be a voltage above $V_{input,max}-V_{tp1}$, while bias_out2 may be chosen to be a voltage equal to $V_{bias2\_out\_disable}$, which can be a level specifically chosen to avoid electrical overstress for MP0 and MP2 in FIG. 3A and may depend on process technology and the maximum input voltage level. In one embodiment, the bias voltage source bias_in supplies a voltage equal to $V_{bias}$. In one embodiment, logic circuits 360 and 370 are multiplexer circuits.

Figure 3D:
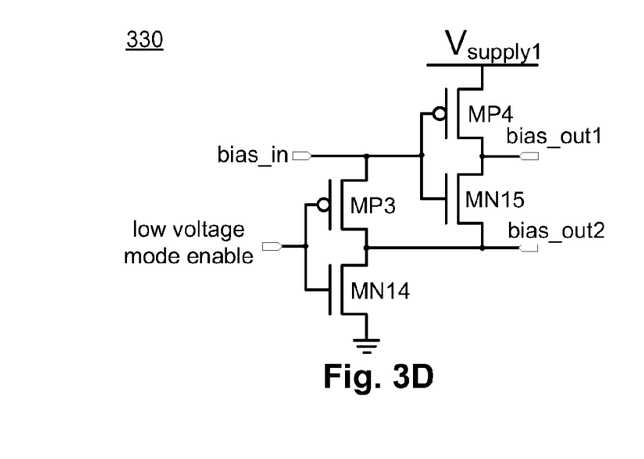

FIG. 3D illustrates a selection circuit 330, which implements control circuit 320 of FIG. 3C, according to one embodiment. It is pointed out that those elements of FIG. 3D having the same reference numbers (or names) as the elements of any other figure can operate or function in any manner similar to that described, but are not limited to such.

In one embodiment, MP3's source terminal is coupled with a bias voltage source bias_in. MN14's source terminal is coupled with a voltage which is lower than or equal to $V_{bias}-V_{tn}-V_{tp}$, where $V_{tn}$ and $V_{tp}$ are the threshold voltages for n-type and p-type transistors respectively in FIG. 3A. The gate terminals of both MP3 and MN14 are coupled to a control signal "low voltage mode enable." The drain terminals of both MP3 and MN14 are coupled together at the node bias_out2. In one embodiment, MN14 source terminal is coupled to ground. In such an embodiment, the combination of MP3 and MN14 chooses between the bias voltage and ground for bias_out2, based on control signal "low voltage mode enable."

In one embodiment, MP4's source terminal is coupled with supply voltage $V_{supply1}$. MN15's source terminal is coupled with bias_out2. The gate terminals of both MP4 and MN15 are coupled to the bias voltage source bias_in. The drain terminals of both MP4 and MN15 are coupled together at the node bias_out1. In this embodiment, the combination of MP4 and MN15 chooses between bias_out2 and supply voltage $V_{supply1}$, based on their strengths relative to $V_{bias}$ for bias_out1. In one embodiment, the bias voltage may be generated within selection circuit 330.

In one embodiment, the voltage source bias_in supplies a voltage equal to $V_{bias}$. In this embodiment, during a high voltage mode operation, where the maximum input voltage exceeds $V_{bias}$, control signal "low voltage mode enable" is set at a voltage low enough to disable MN14 and to enable MP3. In such an embodiment, MP3 and MN14 combination selects $V_{bias}$ for bias_out2. In one embodiment, the supply voltage $V_{supply1}$ is set to a voltage equal to $V_{input,max}-V_{tp1}$, which is presumed to be at least one threshold voltage higher than $V_{bias}$. Therefore, MP4's gate terminal is set to a voltage equal to $V_{bias}$, while its source voltage is at $V_{supply1}$ which is equal to $V_{input,max}-V_{tp1}$, and MP4 can be enabled to bring bias_out1 to a value equal to $V_{supply1}$. In such embodiment, both the gate and source voltages of MN15 are equal to $V_{bias}$, while the drain voltage of MN15 is equal to $V_{supply1}$, therefore MN15 is disabled. In one embodiment, the values of $V_{input,max}$ and $V_{bias}$ can be chosen such that the maximum gate-drain and gate-source voltage differences of MP0, MP1, and MP2 of FIG. 3A, which can be either $V_{input,max}-V_{bias}$ (when input is maximum) or $V_{bias}$ (when input is ground), is within a range that mitigates electrical overstress for the specific process technology.

In one embodiment, the voltage source bias_in supplies a voltage equal to $V_{bias}$. In this embodiment, during a low voltage mode operation, where the maximum input voltage is equal to $V_{bias}$, control signal "low voltage mode enable" is at a voltage high enough to disable MP3 and to enable MN14. In such an embodiment, the MP3 and MN14 combination selects ground for bias_out2. In one embodiment, $V_{supply1}$ is set to a level equal or lower than $V_{bias}$. In such embodiment, MN15's gate terminal is at voltage equal to $V_{bias}$ and source terminal is at ground, therefore MN15 is enabled to select bias_out2 for bias_out1, bringing bias_out1 to ground. In such embodiment, both the gate and source voltages of MP4 are at a value equal to $V_{bias}$, while MP4's drain voltage is at 0v, therefore MP4 is disabled.

An example is provided to illustrate the embodiments. In this example, during a high voltage mode the maximum input voltage is 3.3v and $V_{supply1}$ equals 3.3v, while during a low voltage mode the maximum input voltage is 1.8v and $V_{supply1}$ equals 1.8v. Besides, $V_{bias}$ is fixed at 1.8v, while the control signal "low voltage mode enable" is at 0v during the low voltage mode and is at 1.8v during the high voltage mode.

Continuing with the example, during the high voltage mode, the control signal "low voltage mode enable" is at 0v, which disables MN14 and enables MP3 to select $V_{bias}$ for bias_out2, therefore bringing bias_out2 to 1.8v. Also, MP4 is enabled to select $V_{supply1}$ (3.3v) for bias_out1, while MN15 is disabled with both its gate and source voltages at 1.8v. During the low voltage mode, the control signal "low voltage mode enable" is 1.8v and $V_{supply1}$ is lowered to 1.8v. MN14 is enabled to select 0v for bias_out2, while MP3 is disabled with both of its gate and source terminals at the same voltage of 1.8v. MN15 is enabled to select bias_out2 for bias_out1, thereby bringing bias_out1 to 0v as well. It is understood that these voltage levels are exemplary only, and the embodiments may be applied with voltage levels for control signals, voltage supplies and input voltage which differ from what is disclosed in this example.

Figure 4A:
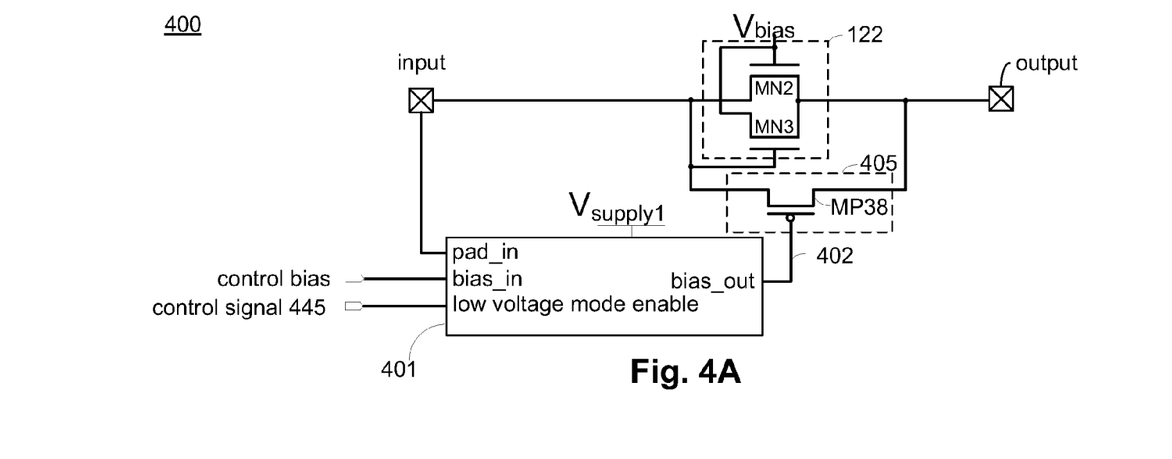
FIGS. 4A-4C are voltage buffers, according to some embodiments of the disclosure.

FIG. 4A shows one implementation 400 of voltage buffer circuit 230 in FIG. 2B, according to one embodiment. It is pointed out that those elements of FIG. 4A having the same reference numbers (or names) as the elements of any other figure can operate or function in any manner similar to that described, but are not limited to such.

In one embodiment, voltage buffer circuit 400 comprises voltage limiter circuit 122, bypass circuit 405, and control circuit 401. Both voltage limiter circuit 122 and bypass circuit 405 are coupled with the input node and the output node of voltage buffer circuit 400. In one embodiment, bypass circuit 405 comprises a single p-type transistor MP38 with its source terminal coupled with the input node, its drain terminal coupled with the output node, and its gate terminal coupled to a control signal 402. In one embodiment, during a low voltage where the maximum input voltage equals $V_{bias}$, bypass circuit 405 may be enabled to form a bypass path between the input and the output nodes. In one embodiment, during a high voltage mode where the maximum input voltage exceeds $V_{bias}$, bypass circuit 405 may be disabled to sever the bypass path. In one embodiment, control circuit 401, operating under supply voltage $V_{supply1}$, controls bypass circuit 405 through control signal 402.

In one embodiment, during the high voltage mode, control circuit 401 disables circuit 405 by having control signal 402 track the input voltage until it drops below $V_{bias}$, after which control circuit 401 can clamp control signal 402 at $V_{bias}$. For a p-type transistor to conduct, its source voltage has to exceed its gate voltage by at least one threshold voltage. In one embodiment, MP38 is disabled when its source voltage is either the same as the gate voltage, when input voltage exceeds $V_{bias}$, or less than the gate voltage, when input voltage drops below $V_{bias}$. In such an embodiment, in addition to disabling MP38, the gate-source and gate-drain voltage differences of MP38 are limited. Without such a scheme and having MP38's gate fixed at a high voltage (e.g., $V_{input,max}-V_{tp}$, where $V_{tp}$ is MP38's threshold voltage) to block out high voltage input, excessive gate-drain and gate-source voltages may develop for the transistor as the input and node n swings to ground, which may lead to electrical overstress.

In one embodiment, during the low voltage mode, control circuit 401 enables bypass circuit 405 by driving control signal 402 to a level below $V_{bias}-V_{tn}-V_{tp}$, where $V_{tn}$ is the threshold of n-type transistors in the circuit. In such an embodiment, MP38 can conduct a voltage between $V_{bias}-V_{tn}$ and $V_{bias}$, while voltage limiter circuit 122 can cover input voltage below $V_{bias}-V_{tn}$. In one embodiment, the combination of voltage limiter circuit 122 and bypass circuit 405 allows voltage buffer circuit 400 to conduct a voltage between ground and $V_{bias}$.

Figure 4B:
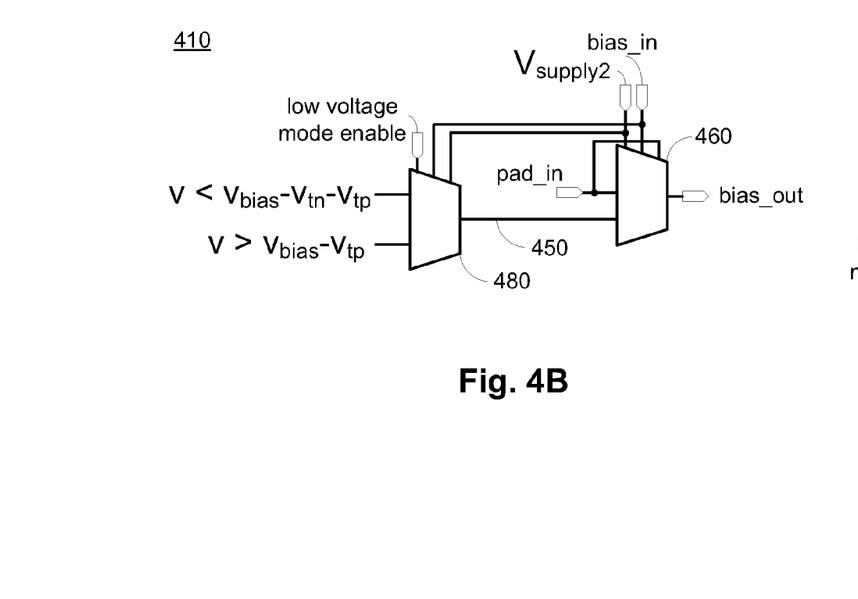

FIG. 4B illustrates one implementation of control circuit 401 in FIG. 4A, according to one embodiment. It is pointed out that those elements of FIG. 4B having the same reference numbers (or names) as the elements of any other figure can operate or function in any manner similar to that described, but are not limited to such.

In one embodiment, control circuit 410 comprises logic circuits 460 and 480 to choose different voltage levels for bias_out between a low voltage mode and a high voltage mode. In one embodiment, the low voltage mode is when the maximum input voltage level is equal to $V_{bias}$, while the high voltage mode is when the maximum input voltage exceeds $V_{bias}$.

In one embodiment, bias_out is control signal 402 in FIG. 4A. In one embodiment, logic circuits 460 and 480 may take in any combination of the control signal "low voltage mode enable," the input voltage, a bias voltage bias_in, and voltage supply $V_{supply1}$, some or all of which may vary between the high voltage and the low voltage modes, to make the selection. In one embodiment, the bias voltage source bias_in supplies a voltage equal to $V_{bias}$. In one embodiment, logic circuits 460 and 480 are multiplexer circuits.

In one embodiment, during the high voltage mode, logic circuit 480 may choose its output, which is signal 450, a voltage above $V_{bias}-V_{tp}$ which sets the lower limit for bias_out. In one embodiment, signal 450 is fed into logic circuit 460, which may choose for bias_out either the input voltage when it exceeds $V_{bias}$ (i.e., bias_out tracks the input voltage), or signal 450 (i.e., a voltage above $V_{bias}-V_{tp}$) when the input voltage is below $V_{bias}$. In such an embodiment, the gate voltage of MP38 tracks the input voltage until it goes below $V_{bias}$, after which the gate voltage will be clamped at a voltage above $V_{bias}-V_{tp}$. In one embodiment, during the low voltage mode, logic circuit 480 may choose its output a voltage below $V_{bias}-V_{tp}-V_{tn}$ to enable MP38. In one embodiment, this voltage is then chosen by logic circuit 460 for bias_out.

Figure 4C:
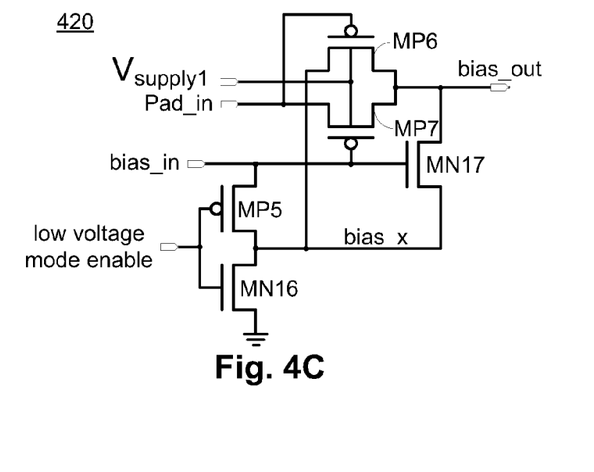

FIG. 4C illustrates a selection circuit 420, which implements control circuit 410 of FIG. 4B, according to one embodiment. It is pointed out that those elements of FIG. 4C having the same reference numbers (or names) as the elements of any other figure can operate or function in any manner similar to that described, but are not limited to such.

In one embodiment, the voltage source bias_in supplies a voltage equal to $V_{bias}$. In this embodiment, MP5's source terminal is coupled with a bias voltage source bias_in. MN16's source terminal is coupled with a voltage which is lower than or equal to $V_{bias}-V_{tp}-V_{tn}$, where $V_{tn}$ and $V_{tp}$ are the threshold voltages for n-type and p-type transistors respectively in FIG. 4A. The gate terminals of both MP5 and MN16 are connected to a control signal "low voltage mode enable." The drain terminals of both MP5 and MN16 are coupled together at the node bias_x. In one embodiment, MN16 source terminal is coupled to ground. In such an embodiment, the combination of MP5 and MN16 chooses between the bias voltage and ground for internal signal bias_x, based on the control signal "low voltage mode enable."

In one embodiment, the drain terminals of MP6, MP7, and MN17 are coupled together at node bias_out. The source terminals of MP6 and MN17 are coupled with the node bias_x, while the source terminal of MP7 is coupled with a node pad_in, which is coupled to the input node of the voltage buffer circuit 400. Therefore, the combination of MN17, MP6 and MP7 selects between the input voltage and bias_x for bias_out. The gate terminal of MP6 is coupled with the node pad_in, while the gate terminals of MN17 and MP7 are coupled together with the bias voltage source. In one embodiment, selection circuit 420 chooses between bias_x, the input voltage or the bias voltage depending on an instantaneous voltage level at the input node of voltage buffer circuit 400 and modes of operation (e.g., a high voltage mode versus a low voltage mode) for bias_out. In one embodiment, the bias voltage may be generated within selection circuit 420.

In one embodiment, the voltage source bias_in supplies a voltage equal to $V_{bias}$. In this embodiment, during a high voltage mode operation, where the maximum input voltage exceeds $V_{bias}$, the control signal "low voltage mode enable" can be at a voltage low enough to disable MN16 and to enable MP5, therefore the MP5 and MN16 combination selects $V_{bias}$ for bias_x. In one embodiment, when an instantaneous input voltage is below $V_{bias}-V_{tp}$, MP6 is enabled since its gate voltage (same as the input voltage) is less than its source voltage (i.e., $V_{bias}$) by at least one threshold voltage $V_{tp}$, while MP7 is disabled since its gate voltage (also $V_{bias}$) is higher than its source voltage (same as the input voltage). MN17 is also disabled with its gate, source and drain terminals at a voltage equal to $V_{bias}$. In one embodiment, with MP6 enabled and MP7 and MN17 disabled, the MP6, MP7, and MN17 combination selects bias_x for bias_out. In such an embodiment, bias_out is limited at $V_{bias}$.

In one embodiment, during the high voltage mode when an instantaneous input voltage is above $V_{bias}+V_{tp}$, MP6 is disabled since its gate voltage (same as the input voltage) is now higher than its source voltage (i.e., $V_{bias}$), while MP7 is enabled since its gate voltage (i.e., $V_{bias}$) is less than its source voltage (same as the input voltage) by at least one $V_{tp}$. In such an embodiment, the MP6 and MP7 combination selects the input voltage for bias_out, while MN17 is disabled with its gate and source terminals at a voltage equal to $V_{bias}$. In such an embodiment, bias_out tracks the input voltage.

In one embodiment, during a low voltage mode, where the maximum input voltage is equal to or below $V_{bias}$, the control signal "low voltage mode enable" is at a voltage high enough to enable MN16 and to disable MP5, thereby choosing ground for bias_x. In one embodiment, since the maximum input voltage is equal to $V_{bias}$ during the low voltage mode, the source-gate voltage difference for both MP6 and MP7 is either zero or negative. In such an embodiment, both transistors MP6 and MP7 are disabled. In one embodiment, MN17 can then choose bias_x for bias_out, thereby bringing bias_out to ground.

An example is provided to illustrate the embodiments. In this example, during a high voltage mode the maximum input voltage is 3.3v, while during a low voltage mode the maximum input voltage is 1.8v. Voltage buffer circuit 400 operates under a fixed voltage $V_{supply1}$ equal to 3.3v. Besides, $V_{bias}$ is fixed at 1.8v. During the high voltage mode, the control signal "low voltage mode enable" is at 0v, which disables MN16 and enables MP5, therefore setting bias_x to 1.8v. MN17 is disabled since both its gate and its source voltages are at 1.8v. When the input voltage is below or equal to 1.8v-$V_{tp}$, with its source tied to the input, MP7 is also disabled since its gate voltage (fixed at 1.8v) exceeds its source voltage. With its gate tied to input, MP6 is enabled since its gate voltage is lower than its source voltage (i.e., fixed at 1.8v) by at least one $V_{tp}$. Therefore, MP6 selects bias_x for bias_out, thereby clamping bias_out at 1.8v.

Continuing with the example, as an instantaneous input voltage increases beyond $1.8v+V_{tp}$, MP6 is disabled because its gate voltage now exceeds its 1.8v source voltage, while MP7 is enabled because its 1.8v gate voltage is lower than its source voltage by at least one $V_{tp}$. Therefore MP7 will select the instantaneous input voltage for bias_out, allowing bias_out to track the input voltage. During the low voltage model, the control signal "low voltage mode enable" is at 1.8v, which brings bias_x to ground. MN17, with its gate voltage remains at 1.8v, can bring bias_out to 0v. With their source terminals now driven to ground, MP6 and MP7 can be disabled, since for both transistors the gate voltage is equal to or exceeds both the source and drain voltages. With its gate terminal (tied to bias_out) fixed at 0v, MP38 of circuit 405 in FIG. 4A can then be enabled to conduct a 1.8v signal.

Figure 5:
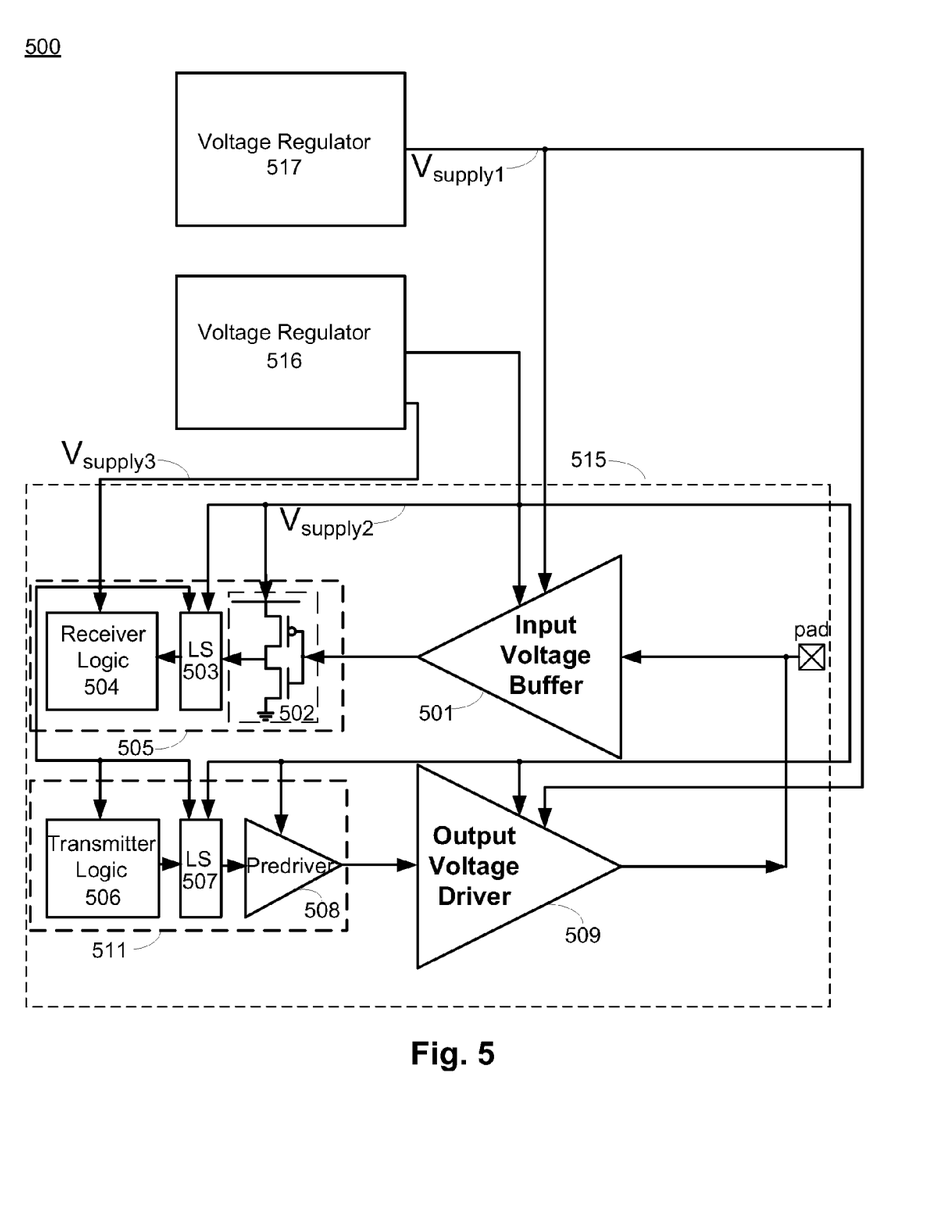
FIG. 5 illustrates an input-output (I/O) pair circuit with the voltage buffer, according to one embodiment.

FIG. 5 illustrates a system 500 having an input-output (I/O) circuit 515 which comprises a receiver circuit 505, a transmitter circuit 511, an output voltage driver circuit 509, an input voltage buffer circuit 501, and voltage regulator circuits 516 and 517. It is pointed out that those elements of FIG. 5 having the same reference numbers (or names) as the elements of any other figure can operate or function in any manner similar to that described, but are not limited to such.

In one embodiment, the input node of input voltage buffer circuit 501 and the output node of output voltage buffer circuit 509 are coupled with the pad, through which input-output circuit 515 communicates with other devices. In one embodiment, ESD (electrostatic discharge) devices, which are not shown in FIG. 5, may be coupled to the pad to avoid subjecting input voltage buffer circuit 501 and output voltage buffer circuit 509 to huge current resulted from electrostatic discharge events at the pad, which may otherwise damage the transistors inside input voltage buffer circuit 501 and output voltage buffer circuit 509.

In one embodiment, voltage regulator circuit 517 supplies a voltage $V_{supply1}$, while voltage regulator circuit 516 supplies two voltages $V_{supply2}$ and $V_{supply3}$. In one embodiment, both input voltage buffer circuit 501 and output voltage buffer circuit 509 operate under supply voltages $V_{supply1}$ and $V_{supply2}$. In one embodiment, transmitter circuit 511 comprises a transmitter logic circuit 506 operating under a supply voltage of $V_{supply3}$, a pre-driver circuit 508 operating under a supply voltage of $V_{supply2}$, and a level shifter circuit 507 which operates under two supply voltages of $V_{supply2}$ and $V_{supply3}$.

In one embodiment, transmitter logic circuit 506 may receive data from other logic units not shown in FIG. 5. In one embodiment, transmitter logic circuit 506 may send out signals which swing between ground and $V_{supply3}$. In one embodiment, level shifter circuit 507 receives signal from transmitter logic circuit 506, where the signal swings between ground and $V_{supply2}$. In one embodiment, level shifter 507 then convert the signal to a swing between ground and $V_{supply2}$ before sending the signal to the pre-driver circuit 508, which then send the signals to the output voltage driver circuit 509. In one embodiment, output voltage driver circuit 509 drives the signals to the pad and may be configured with a specific slope, swing or other relevant settings to achieve the optimum signaling quality at the pad.

In one embodiment, receiver circuit 505 comprises a receiver logic circuit 506 operating under a supply voltage of $V_{supply3}$, a level-detecting circuit 502 operating under a supply voltage of $V_{supply2}$, and a level shifter circuit 503 which operates under two supply voltages of $V_{supply2}$ and $V_{supply3}$. In one embodiment, input voltage buffer circuit 501 operates under supply voltages $V_{supply1}$ and $V_{supply2}$. In one embodiment, input voltage buffer circuit 501 receives a signal from the pad and may output a signal which swings between ground and $V_{supply2}$ to level-detecting circuit 502. In one embodiment, level shifter circuit 503 receives a signal from level-detecting circuit 502, wherein the signal swings between ground and $V_{supply2}$, and then converts the signal to a swing between ground and $V_{supply3}$ before sending it to receiver logic circuit 504. In one embodiment, receiver logic circuit 504 may then process the signal to generate some data, and then output those data, which also swing between ground and $V_{supply3}$, to other logic units not shown in FIG. 5.

In one embodiment, voltage regulator circuit 517 may set $V_{supply1}$ substantially equal to $V_{supply2}$ during a low voltage mode, and may maintain $V_{supply1}$ at a higher value than $V_{supply2}$ during a high voltage mode. In one embodiment, input voltage buffer circuit 501 comprises bypass circuit 302, voltage limiter circuit 122 and control circuit 301 of FIG. 3A. In one embodiment, control circuit 301 operates under the variable voltage supply $V_{supply1}$, whereas the fixed voltage supply $V_{supply2}$ is used to generate the bias voltage source, the control bias, the clamp_bias1, the clamp_bias2 and the control signal 345 of FIG. 3A.

In another embodiment, voltage regulator circuit 517 may maintain $V_{supply1}$ at a higher value than $V_{supply2}$ without change between different modes of operation. In one embodiment, the input voltage buffer circuit 501 comprises voltage limiter circuit 122, bypass circuit 405 and control circuit 401 of FIG. 4A. In one embodiment, control circuit 401 operates under the voltage supply $V_{supply1}$, while voltage supply $V_{supply2}$ may be used to generate the bias voltage source, the control bias, and the control signal 445 of FIG. 4A.

Figure 6:
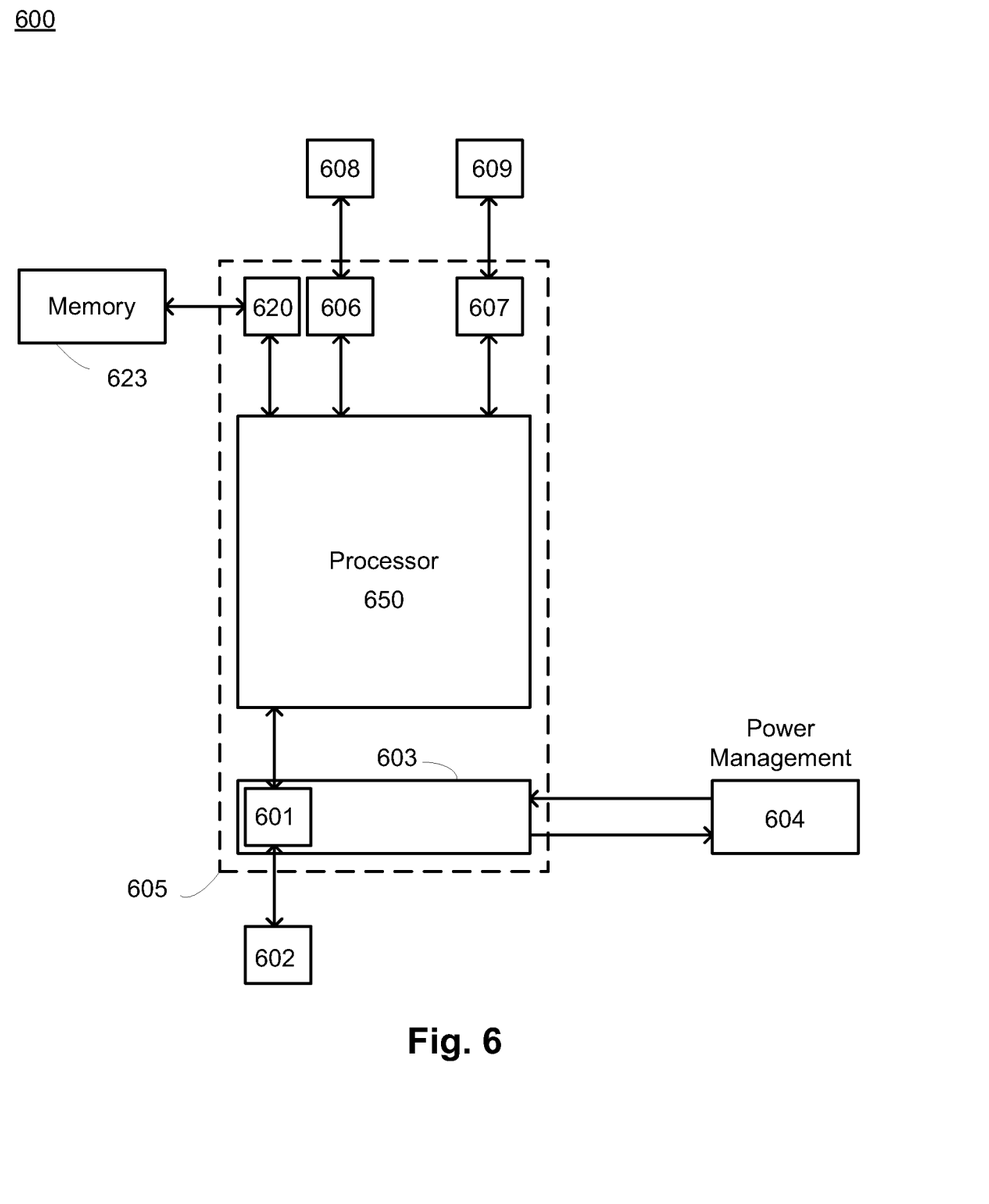
FIG. 6 is a system-level diagram of a smart system comprising a processor and at least one interface circuit which incorporates an embodiment of the disclosure.

FIG. 6 is a system-level platform 600 of a smart device 605, according to one embodiment. It is pointed out that those elements of FIG. 6 having the same reference numbers (or names) as the elements of any other figure can operate or function in any manner similar to that described, but are not limited to such.

In one embodiment, system platform 600 comprises smart device 605 and memory device 623, together with devices 602, 608 and 609. In one embodiment, smart device 605 comprises a processor 650, an interface circuit 603 which contains at least one input-output pair 601 used to interact with device 602, an interface circuit 620 through which the processor accesses memory 623, an interface circuit 606 through which the processor accesses device 608, and an interface circuit 607 through which the processor accesses device 609. In one embodiment, a power management unit 604, which may be a standalone component on system platform 600 or be part of smart device 605, provides supply voltages to at least interface circuit 603. In one embodiment, power management unit 604 may also provide supply voltages to other components of smart device 605. In one embodiment, interface circuit 603 may also instruct power management unit 604 to adjust any of its voltage supplies.

In one embodiment, device 608 is an audio subsystem which may represent both hardware (e.g., audio hardware and audio circuits) and software (e.g., drivers, codecs, etc.) components associated with providing audio functions to the smart device 605. In one embodiment, audio functions may include speaker and/or headphone output, as well as microphone input. In one embodiment, devices for such functions may be integrated into device 608, or connected to the device 608. In one embodiment, a user interacts with device 608 by providing audio commands that are received and processed by processor 650.

In one embodiment, device 609 is a display subsystem which may represent hardware (e.g., display devices) and software (e.g., drivers) components that provide a visual and/or tactile display for a user to interact with the smart device 605. In one embodiment, interface circuit 607 may include logic separated from processor 650 to perform at least some processing related to the display. In one embodiment, device 609 may include a touch screen (or touch pad) device that provides both output and input to a user.

In one embodiment, processor 650 may include one or more physical devices, such as microprocessors, application processors, microcontrollers, programmable logic devices, audio processor, video processor, or other processing means. In one embodiment, the processing operations performed by processor 650 may include the execution of an operating platform or operating system on which applications and/or device functions are executed. In one embodiment, the processing operations may include operations related to I/O (input/output) with a human user or with other devices, such as storage, wireless communication or wired-communication with another smart devices, etc. In one embodiment, the processing operations may also include operations related to audio I/O and or display I/O.

In one embodiment, device 602 is a storage device which may support a low voltage mode operation, where the device's maximum output voltage is at a pre-determined value (e.g., 1.8v), and a high voltage mode operation, where the device's maximum output voltage exceeds that pre-determined value. In one embodiment, device 602 is a Secure Digital (SD) card. In one embodiment, processor 650 may be instructed to read in audio and video data from the audio device 608 and the display device 609, to store the data in memory 623, and to read back the data from memory 623 and to write to storage device 602 through input-output pair 601.

In one embodiment, processor 650 may also be instructed to read data from storage device 602 through input-output pair 601, to write the data to memory 623, to read back the data from memory 623, and to output to audio device 608 and/or video device 609. In one embodiment, the input-output pair 601 contains at least one instance of the input voltage buffer circuit in FIG. 5, where the maximum output voltage of the buffer can be maintained at a pre-determined value (e.g., 1.8v), as long as the maximum input voltage to the buffer is equal to or exceeds the pre-determined value (e.g., 1.8v). In one embodiment, when device 602 operates during a low voltage mode where the device's maximum output voltage is equal to the pre-determined value (e.g., 1.8v), the input voltage buffer circuit inside the input-output pair 601 may maintain is maximum output voltage to the downstream level-detecting circuit at that pre-determined value. In one embodiment, when device 602 operates during a high voltage mode where the device's maximum output voltage exceeds the pre-determined value (e.g., 1.8v), the input voltage buffer circuit inside the input-output pair 601 may also limit is maximum output voltage to the downstream level-detecting circuit at that pre-determined value.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e. g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e. g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a first node to receive signal, a second node to provide an output signal, a voltage limiter circuit coupled to the first and the second nodes, and a bypass circuit coupled to the voltage limiter circuit, the bypass circuit capable of being enabled to electrically short the first node to the second node. In one embodiment, the voltage limiter circuit limits the voltage at the second node to a value substantially equal to a pre-determined value when the voltage at the first node exceeds said pre-determined value. In one embodiment, the apparatus further comprises a control circuit capable of enabling and disabling the bypass circuit. In one embodiment, the control circuit disables the bypass circuit when the maximum voltage at the first node exceeds the pre-determined value. In one embodiment, the control circuit enables the bypass circuit when the maximum voltage at the first node is substantially equal to or substantially below the pre-determined value.

In one embodiment, the apparatus further comprises a level-detecting circuit having an input node coupled to the second node, and having an output node to provide a signal to one or more logic units. In one embodiment, the apparatus further comprises a first voltage regulator circuit supplying a first supply voltage to the voltage limiter circuit, the bypass circuit and the control circuit. In one embodiment, the apparatus further comprises a second voltage regulator circuit supplying a second supply voltage which is substantially equal to the pre-determined value to the level-detecting circuit.

In one embodiment, the bypass circuit comprises a first transistor, a second transistor, and a third transistor coupled in series. In one embodiment, the first transistor has a source terminal coupled to the first node, a drain terminal coupled to the second transistor, and a gate terminal controllable by the control circuit. In one embodiment, the second transistor has a source terminal coupled to the first transistor, a drain terminal coupled to the second node, and a gate terminal controllable by the control circuit. In one embodiment, the third transistor has a source terminal coupled to the second transistor, a drain terminal coupled to the second node, and a gate terminal controllable by the control circuit.

In one embodiment, the control circuit disables the bypass circuit by setting the voltage at the gate terminal of the second transistor to a value higher than a maximum voltage at the first node minus one threshold voltage of the second transistor. In one embodiment, while disabling the bypass circuit, the control circuit also sets the voltages at the gate terminals of the first and the third transistor respectively to a value higher than the pre-determined value minus one threshold voltage of the first and third transistors respectively. In one embodiment, the control circuit enables the bypass circuit by setting the voltages at the gate terminals of the first, second and third transistors to respective values which are substantially less than or substantially equal to the pre-determined value minus one threshold voltage of the first, second and third transistor respectively.

In one embodiment, the first voltage regulator is capable of changing the first supply voltage. In one embodiment, the control circuit is controllable by a first control signal and is capable of detecting change in the first supply voltage. In one embodiment, the first voltage regulator changes the first supply voltage to a value substantially equal to the second supply voltage when the maximum voltage at the first node is substantially equal to or substantially below the pre-determined value.

In one embodiment, the bypass circuit comprises a single transistor. In one embodiment, the single transistor in the bypass circuit has a source terminal coupled with the first node, a drain terminal coupled with the second node, and a gate terminal controllable by the control circuit.

In one embodiment, the control circuit disables the bypass circuit by causing a voltage at the gate terminal of the single transistor to track an instantaneous voltage at the first node when said voltage is above the pre-determined value. In one embodiment, the control circuit also disables the bypass circuit by causing the voltage at the gate terminal of the single transistor at a value above the pre-determined value minus one threshold voltage of the single transistor when the instantaneous voltage at the first node is substantially less than or is substantially equal to the pre-determined value. In one embodiment, the control circuit enables the bypass circuit by setting the voltage at the gate terminal of the single transistor at a value substantially less than or is substantially equal to the pre-determined value minus one threshold voltage of the single transistor. In one embodiment, the control circuit is controllable by a second control signal and is capable of detecting the instantaneous voltage at the first node.

In another example, in one embodiment, an apparatus comprises: a pad node through which the apparatus communicates with other devices, an input voltage buffer with an input node and an output node, the input node coupled with the pad node and the output node coupled with a receiver circuit. In this embodiment, the input voltage buffer is according to the apparatus discussed above.

In another example, in one embodiment, a system comprises: a processor core, a connector coupled to a first device whose maximum output voltage varies between a low voltage and a high voltage, and a first interface circuit coupled to the processor core and to the connector. In this embodiment, the first interface circuit comprises at least one input voltage buffer with an input node and an output node. In this embodiment, the input voltage buffer is according to the apparatus discussed above.

In one embodiment, the system further comprises a memory unit. In one embodiment, the system further comprises a second interface circuit coupled to the processor core and to the memory unit, the processor core to read and to write to the memory unit through the second interface circuit. In one embodiment, the system further comprises a power management unit which generates voltage supplies to at least the first interface circuit. In one embodiment, the power management unit is capable of adjusting supply voltages to the first interface circuit upon receiving a signal from the first interface circuit or from the processor core. In one embodiment, at least one of the first or second interface circuits is integrated with the processor core as a System-on-Chip (SoC). In one embodiment, at least part of the power management unit is integrated with the processor core as a SoC.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   a first node to receive signal;
   a second node to provide an output signal;
   a voltage limiter circuit to operate under a first supply voltage, the voltage limiter circuit coupled to the first and second nodes; and
   a bypass circuit to operate under the first supply voltage, the bypass circuit coupled to the voltage limiter circuit, the bypass circuit capable of being enabled to electrically short the first node to the second node.

2. The apparatus of claim 1 further comprises a control circuit capable of enabling and disabling the bypass circuit.

3. The apparatus of claim 2, wherein the control circuit to enable the bypass circuit when the maximum voltage at the first node is substantially equal to or substantially below the pre-determined value, and to disable the bypass circuit when the maximum voltage at the first node exceeds the pre-determined value.

4. The apparatus of claim 2, wherein the bypass circuit further comprises a first transistor, a second transistor, and a third transistor coupled in series.

5. The apparatus of claim 4, wherein the control circuit to disable the bypass circuit by setting voltage at a gate terminal of the second transistor to a value higher than a maximum voltage at the first node minus one threshold voltage of the second transistor.

6. The apparatus of claim 4, wherein the control circuit to enable the bypass circuit by setting voltages at the gate terminals of the first, second, and the third transistors to respective values which are substantially less than or substantially equal to the pre-determined value minus one threshold voltage of the first, second, and third transistors respectively.

7. The apparatus of claim 2, wherein the bypass circuit further comprises a single transistor.

8. The apparatus of claim 7, wherein the control circuit to disable the bypass circuit by causing a voltage at a gate terminal of the single transistor to track an instantaneous voltage at the first node when said voltage is above the pre-determined value, and by setting the voltage at the gate terminal of the single transistor at a value above the pre-determined value minus one threshold voltage of the single transistor when the instantaneous voltage at the first node is substantially less than or is substantially equal to the pre-determined value.

9. The apparatus of claim 7, wherein the control circuit to enable the bypass circuit by setting a voltage at the gate terminal of the single transistor at a value substantially less than or is substantially equal to the pre-determined value minus one threshold voltage of the single transistor.

10. An apparatus comprising:
a pad node through which the apparatus communicates with other devices;
an input voltage buffer circuit with an input and an output node, the input node coupled with the pad node, the input voltage buffer circuit outputs a voltage substantially equal to a pre-determined value when voltage at the pad is substantially equal to or above the pre-determined value; and
a receiver circuit coupled with the output node of the input voltage buffer circuit, wherein the input voltage buffer circuit further comprises a voltage limiter circuit, a bypass circuit and a control circuit, wherein the bypass circuit further comprises a first transistor, a second transistor and a third transistor coupled in series, wherein the control circuit to disable the bypass circuit by setting voltage at a gate terminal of the second transistor to a value higher than a maximum voltage at the input node of the input voltage buffer circuit minus one threshold voltage of the second transistor.

11. The apparatus of claim 10, wherein the control circuit to enable the bypass circuit by setting the voltages at the gate terminals of the first, second, and the third transistors to respective values which are substantially less than or substantially equal to the pre-determined value minus one threshold voltage of the first, second, and third transistors respectively.

12. An apparatus comprising:
a pad node through which the apparatus communicates with other devices;
an input voltage buffer circuit with an input and an output node, the input node coupled with the pad node, the input voltage buffer circuit outputs a voltage substantially equal to a pre-determined value when voltage at the pad is substantially equal to or above the pre-determined value; and a receiver circuit coupled with the output node of the input voltage buffer circuit, wherein the input voltage buffer circuit further comprises a voltage limiter circuit, a bypass circuit and a control circuit, wherein the bypass circuit further comprises a single transistor, wherein the control circuit to enable the bypass circuit by setting a voltage at the gate terminal of the single transistor at a value substantially less than or is substantially equal to the pre-determined value minus one threshold voltage of the single transistor.

13. The apparatus of claim 12, wherein the control circuit to disable the bypass circuit by causing a voltage at a gate terminal of the single transistor to track an instantaneous voltage at the input node of the input voltage buffer circuit when said voltage is above the pre-determined value, and by setting the voltage at the gate terminal of the single transistor at a value above the pre-determined value minus one threshold voltage of the single transistor when the instantaneous voltage at the input node of the input voltage buffer circuit is substantially less than or is substantially equal to the pre-determined value.

14. A system comprising:
a processor core;
a connector coupled to a first device whose maximum output voltage varies between a low voltage and a high voltage; and
a first interface circuit coupled to the processor core and to the connector, the first interface circuit comprises at least one input voltage buffer to output a voltage substantially equal to a pre-determined value when the output voltage of the first device is substantially equal to or above the pre-determined value, wherein the at least one input voltage buffer further comprises a voltage limiter circuit, a bypass circuit and a control circuit that is capable of enabling the bypass circuit to electrically short an input node and an output node of the at least one input voltage buffer.

15. The system of claim 14, wherein the control circuit capable of enabling and disabling the bypass circuit, wherein the control circuit to enable the bypass circuit when the maximum voltage at the input node is substantially equal to or substantially below the pre-determined value, and to disable the bypass circuit when the maximum voltage at the input node exceeds the pre-determined value.

16. The system of claim 15, wherein the interface circuit is integrated with the processor core as a System-on-Chip (SoC).

* * * * *